(12) United States Patent
Bei

(10) Patent No.: US 10,860,772 B2
(45) Date of Patent: Dec. 8, 2020

(54) METHOD AND APPARATUS FOR DESIGNING INTERCONNECTION STRUCTURE AND METHOD FOR MANUFACTURING INTERCONNECTION STRUCTURE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Duohui Bei, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 11 days.

(21) Appl. No.: 16/100,400

(22) Filed: Aug. 10, 2018

(65) Prior Publication Data
US 2019/0179995 A1 Jun. 13, 2019

(30) Foreign Application Priority Data
Dec. 12, 2017 (CN) .......................... 2017 1 1316382

(51) Int. Cl.
*G06F 30/394* (2020.01)
*H01L 27/02* (2006.01)
(Continued)

(52) U.S. Cl.
CPC .......... *G06F 30/394* (2020.01); *H01L 21/768* (2013.01); *H01L 23/522* (2013.01);
(Continued)

(58) Field of Classification Search
CPC ............... G06F 17/5077; G06F 30/394; G06F 2203/0403; H05K 2201/0269;
(Continued)

(56) References Cited

U.S. PATENT DOCUMENTS 5,459,093 A * 10/1995 Kuroda ............... H01L 27/0207
438/599
5,475,608 A * 12/1995 Masuoka .............. G06F 30/392
716/124
(Continued)

FOREIGN PATENT DOCUMENTS

CN 105529300 A 4/2016
CN 107452672 A 12/2017

*Primary Examiner* — Helen Rossoshek
(74) *Attorney, Agent, or Firm* — Brinks Gilson & Lione

(57) ABSTRACT

The present disclosure provides methods and apparatus for designing an interconnection structure and methods for manufacturing an interconnection structure, and relates to the technical field of semiconductors. An implementation of the method may include: designing n virtual interconnection units according to a number of metal interconnection layers in a circuit area of a chip design drawing, where an $i^{th}$ virtual interconnection unit includes i metal interconnection layers, and where adjacent metal interconnection layers in a $j^{th}$ virtual interconnection unit are connected by using vias, and $n \geq 2$, $1 \leq i \leq n$, and $2 \leq j \leq n$; and filling an area in the chip design drawing outside the circuit area with virtual interconnection units, where the $j^{th}$ virtual interconnection unit is filled, and a $(j-1)^{th}$ virtual interconnection unit is not filled unless there is no space in the area for the $j^{th}$ virtual interconnection unit.

12 Claims, 5 Drawing Sheets

(51) Int. Cl.
*H01L 21/768* (2006.01)
*H01L 23/522* (2006.01)

(52) U.S. Cl.
CPC ...... *H01L 23/5226* (2013.01); *H01L 27/0207* (2013.01); *G06F 2203/04103* (2013.01); *H05K 2201/09781* (2013.01)

(58) Field of Classification Search
CPC ... H05K 2201/0195; H05K 2201/0266; H05K 2201/10674; H05K 2201/09781; H01L 27/0207; H01L 21/768; H01L 23/522; H01L 2224/0231; H01L 2224/73203; H01L 23/3192; H01L 23/49894; H01L 2924/14; H01L 23/5226
See application file for complete search history.

(56) References Cited

U.S. PATENT DOCUMENTS

| | | | | |
|---|---|---|---|---|
| 6,080,652 A * | 6/2000 | Yamaha | ............ | H01L 21/76819 257/E21.576 |
| 6,424,585 B1 * | 7/2002 | Ooishi | ............ | G11C 5/143 365/189.09 |
| 6,548,902 B2 * | 4/2003 | Suzuki | ............ | H01L 23/5226 257/758 |
| 7,051,308 B2 * | 5/2006 | McManus | ............ | G06F 17/5068 257/E27.105 |
| 7,221,049 B2 * | 5/2007 | Igarashi | ............ | H01L 21/4857 257/700 |
| 7,319,266 B2 * | 1/2008 | St. Germain | ............ | H01L 23/3107 257/676 |
| 7,426,707 B2 * | 9/2008 | Ichimiya | ............ | G06F 17/5072 716/119 |
| 7,498,199 B2 * | 3/2009 | Yang | ............ | H01L 21/563 257/E21.001 |
| 7,514,794 B2 * | 4/2009 | Naruse | ............ | H01L 27/0207 257/691 |
| 7,565,638 B2 * | 7/2009 | Hoerold | ............ | G06F 17/5068 716/106 |
| 7,761,835 B2 * | 7/2010 | Kitano | ............ | G06F 30/394 716/115 |
| 7,774,726 B2 * | 8/2010 | White | ............ | G06F 30/39 716/51 |
| 7,863,745 B2 * | 1/2011 | Nomoto | ............ | H01L 21/561 257/642 |
| 7,871,925 B2 * | 1/2011 | Kim | ............ | H01L 21/76898 257/620 |
| 7,921,401 B2 * | 4/2011 | Ito | ............ | G06F 17/5018 716/136 |
| 8,212,151 B2 * | 7/2012 | Yamamoto | ............ | H01L 21/563 174/258 |
| 8,278,152 B2 * | 10/2012 | Liu | ............ | H01L 21/76898 257/621 |
| 8,412,506 B2 * | 4/2013 | Yamagajo | ............ | G06F 30/23 703/13 |
| 8,483,997 B2 * | 7/2013 | Li | ............ | G06F 17/5036 703/2 |
| 8,642,385 B2 * | 2/2014 | Xue | ............ | H01L 21/76898 438/113 |
| 8,716,123 B2 * | 5/2014 | Kuo | ............ | H01L 24/11 438/614 |
| 9,091,921 B2 * | 7/2015 | Yoshida | ............ | G03F 7/0047 |
| 9,105,706 B2 * | 8/2015 | Otsuka | ............ | H01L 21/76801 |
| 9,129,818 B2 * | 9/2015 | Kuo | ............ | H01L 21/76838 |
| 9,276,104 B2 * | 3/2016 | Tsunemi | ............ | H01L 27/12 |
| 9,278,505 B2 * | 3/2016 | Shim | ............ | B32B 17/04 |
| 9,312,214 B2 * | 4/2016 | Chen | ............ | H01L 23/49816 |
| 9,508,630 B2 * | 11/2016 | Suzuki | ............ | H01L 21/76819 |
| 9,508,677 B2 * | 11/2016 | Ye | ............ | H01L 25/50 |
| 9,653,312 B2 * | 5/2017 | Hou | ............ | H01L 25/50 |
| 9,666,556 B2 * | 5/2017 | Liu | ............ | H01L 23/3121 |
| 10,651,201 B2 * | 5/2020 | Kim | ............ | H01L 27/11807 |
| 2002/0061608 A1 * | 5/2002 | Kuroda | ............ | H01L 21/31053 438/129 |
| 2002/0083407 A1 * | 6/2002 | Suzuki | ............ | H01L 21/76816 257/774 |
| 2002/0145201 A1 | 10/2002 | Armbrust et al. | | |
| 2005/0082577 A1 * | 4/2005 | Usui | ............ | H01L 24/05 257/211 |
| 2006/0145347 A1 * | 7/2006 | Aida | ............ | H01L 23/3677 257/758 |
| 2007/0288877 A1 | 12/2007 | Matsuoka | | |
| 2008/0213605 A1 * | 9/2008 | Briney | ............ | B32B 27/34 428/473.5 |
| 2011/0001239 A1 * | 1/2011 | Hsieh | ............ | H01L 23/49827 257/738 |
| 2011/0156219 A1 * | 6/2011 | Kawashima | ............ | H01L 22/34 257/620 |
| 2012/0145447 A1 * | 6/2012 | Jung | ............ | H05K 3/0038 174/264 |
| 2012/0301824 A1 * | 11/2012 | Yoshida | ............ | G03F 7/0047 430/270.1 |
| 2013/0033827 A1 * | 2/2013 | Das | ............ | H05K 3/4623 361/752 |
| 2013/0105990 A1 * | 5/2013 | Shibata | ............ | H01L 23/481 257/774 |
| 2014/0252594 A1 * | 9/2014 | Meng | ............ | H01L 21/6835 257/737 |
| 2015/0186584 A1 * | 7/2015 | Aenuganti | ............ | G06F 30/392 716/55 |
| 2018/0060475 A1 * | 3/2018 | Sinha | ............ | G06F 17/5031 |
| 2018/0350791 A1 * | 12/2018 | Do | ............ | H01L 23/485 |
| 2019/0035776 A1 * | 1/2019 | Mori | ............ | H01L 21/76816 |

\* cited by examiner

METHOD AND APPARATUS FOR DESIGNING INTERCONNECTION STRUCTURE AND METHOD FOR MANUFACTURING INTERCONNECTION STRUCTURE

RELATED APPLICATIONS

The present application claims priority to Chinese Patent Appln. No. 201711316382.9, filed Dec. 12, 2017, the entire disclosure of which is hereby incorporated by reference.

BACKGROUND

Technical Field

The present disclosure relates to the technical field of semiconductors, and in particular, to a method and apparatus for designing an interconnection structure and a method for manufacturing an interconnection structure.

Related Art

With the development of an advanced semiconductor technology, the dielectric constant (k) of a dielectric layer between interconnection layers in a back-end process is becoming smaller. As k decreases, a mechanical performance of the dielectric layer gradually degenerates. For example, the hardness and modulus of the dielectric layer become smaller. In addition, an interfacial binding force between different dielectric layers decreases along with the decrease of k.

Therefore, in the advanced semiconductor technology, chip package interaction (CPI) becomes challenging. For example, in a chip packaging process, a crack produced in the dielectric layer or interface layering between different dielectric layers causes a CPI problem, lowering the reliability of chip package.

SUMMARY

An objective of the present disclosure is to improve a reliability of a chip package.

In one aspect of the present disclosure, a method for designing an interconnection structure is provided. The method may include: generating, with a processor, a chip design drawing, wherein generating the chip design drawing include designing n virtual interconnection units according to a number of metal interconnection layers in a circuit area of a chip design drawing, where an $i^{th}$ virtual interconnection unit includes i metal interconnection layers, and where adjacent metal interconnection layers in a $j^{th}$ virtual interconnection unit are connected by using vias, and $n \geq 2$, $1 \leq i \leq n$, and $2 \leq j \leq n$; and filling an area in the chip design drawing outside the circuit area with virtual interconnection units, where the $j^{th}$ virtual interconnection unit is filled, and a $(j-1)^{th}$ virtual interconnection unit is not filled unless there is no space in the area for the $j^{th}$ virtual interconnection unit. The method many additionally include manufacturing an interconnection structure according to the chip design drawing with which the virtual interconnection units are filled.

In some implementations, the number is n.

In some implementations, different vias in a same virtual interconnection unit are vertically aligned.

In another aspect of the present disclosure, a method for manufacturing an interconnection structure is provided. The method may include: filling an area in a chip design drawing outside a circuit area with virtual interconnection units according to a method according to any one of the foregoing embodiments or implementations; and manufacturing an interconnection structure according to the chip design drawing with which the virtual interconnection units are filled.

In still another aspect of the present disclosure, an apparatus for designing an interconnection structure is provided. The apparatus may include: a designing module configured to design n virtual interconnection units according to a number of metal interconnection layers in a circuit area of a chip design drawing, where an $i^{th}$ virtual interconnection unit includes i metal interconnection layers, and where adjacent metal interconnection layers in a $j^{th}$ virtual interconnection unit are connected using vias, and $n \geq 2$, $1 \leq i \leq n$, and $2 \leq j \leq n$; and a filling module configured to fill an area in the chip design drawing outside the circuit area with virtual interconnection units, where the $j^{th}$ virtual interconnection unit is filled, and a $(j-1)^{th}$ virtual interconnection unit is not filled unless there is no space in the area for the $j^{th}$ virtual interconnection unit.

In some implementations, the number is n.

In some implementations, different vias in a same virtual interconnection unit are vertically aligned.

In yet another aspect of the present disclosure, an apparatus for designing an interconnection structure is provided. The apparatus may include: a memory; and a processor coupled to the memory, where the processor is configured to perform a method according to any one of the foregoing embodiments or implementations based on instructions stored in the memory.

In yet another aspect of the present disclosure, a computer readable storage medium storing computer program instructions is provided, where the instructions, when being executed by a processor, cause the processor to perform a method according to any one of the foregoing embodiments or implementations.

In embodiments and implementations of the present disclosure, a non-circuit area is filled with the virtual interconnection units so that the metal interconnection layers are more uniformly distributed, thereby alleviating the micro loading effect. In addition, a laminated structure consisting of the metal interconnection layers and the vias may have a support function that prevents an external force from being applied to a chip in a subsequent packaging process so as to make a dielectric layer sink. In addition, via structures may further be used as stopping walls and prevent fine cracks caused by stress concentration from diffusing and extending. Therefore, the foregoing design of the interconnection structure can improve the shock-resistance and compression-resistance performance of the chip, thereby improving the reliability of chip package.

Exemplary embodiments and implementations of the present disclosure are described in detail below with reference to the accompanying drawings, and other features and aspects of the present disclosure and advantages thereof will become clear.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Exemplary embodiments and implementations of the present disclosure are described in detail with reference to the accompanying drawings. It should be understood that unless otherwise specifically described, relative arrangements, numerical expressions, and values of parts and steps stated in these embodiments and implementations should not be understood as limitations to the scope of the present disclosure.

In addition, it should be understood that for ease of description, sizes of parts shown in the accompanying drawings are not necessarily drawn according to actual proportional relationships. For example, thicknesses or widths of some layers may be magnified relative to other layers.

The following description of exemplary embodiments and implementations is merely illustrative and is not used as any limitation to the present disclosure or application thereof or use thereof in any sense.

Technologies, methods, and apparatuses that are known to a person of ordinary skill in the art may not be discussed in detail, but when being properly used, the technologies, methods, and apparatuses should be considered as a part of this specification.

It should be noted that similar marks and letters represent similar items in the following accompanying drawings. Therefore, once an item is defined or described in an accompanying drawing, the item does not need to be further discussed in subsequent accompanying drawings.

Figure 1:
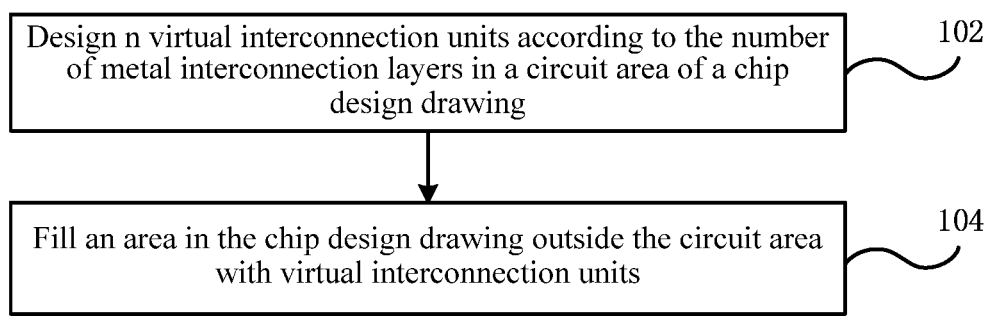
FIG. 1 is a simplified flowchart of a method for designing an interconnection structure.

FIG. 1 is a simplified flowchart of a method for designing an interconnection structure according to an embodiment of the present disclosure.

As shown in FIG. 1, first, step 102: Design n virtual interconnection units according to a number of metal interconnection layers in a circuit area of a chip design drawing, where $n \geq 2$. It should be understood that the circuit area of the chip design drawing is an area of a circuit that is actually working.

An $i^{th}$ virtual interconnection unit includes i metal interconnection layers, where $1 \leq i \leq n$. Adjacent metal interconnection layers in a $j^{th}$ virtual interconnection unit are connected by using vias, where $2 \leq j \leq n$. That is, in other virtual interconnection units other than a first virtual interconnection unit, adjacent metal interconnection layers are all connected by using vias. It should be understood that a dielectric layer is filled between different metal interconnection layers.

In some implementations, the number of metal interconnection layers and the number of types of virtual interconnection units in the circuit area may be the same, that is, they are both n. However, it should be understood that in other implementations, the number of metal interconnection layers and the number of types of virtual interconnection units in the circuit area may be different. For example, the number of metal interconnection layers in the circuit area may alternatively be greater than n.

Figure 2:
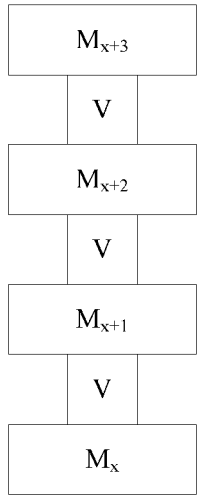
FIG. 2 is a schematic diagram of four virtual interconnection units.
Figure 2:
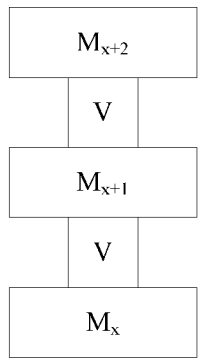
Figure 2:
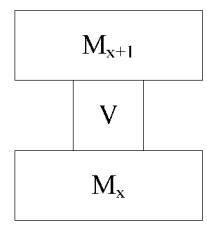
Figure 2:
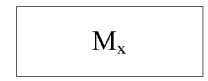

FIG. 2 is a schematic diagram of four virtual interconnection units. In this example, the number of metal interconnection layers in the circuit area of the chip design drawing is 4.

As shown in FIG. 2, a first virtual interconnection unit 201 includes one metal interconnection layer, that is, $M_x$. A second virtual interconnection unit 202 includes two metal interconnection layers, that is, $M_x$ and $M_{x+1}$. A third virtual interconnection unit 203 includes three metal interconnection layers, that is, $M_x$, $M_{x+1}$, and $M_{x+2}$. A fourth virtual interconnection unit 204 includes four metal interconnection layers, that is, $M_x$, $M_{x+1}$, $M_{x+2}$, and $M_{x+3}$.

Adjacent metal interconnection layers in the second, third, and fourth virtual interconnection units may be connected using vias V. In some embodiments, different vias V in a same virtual interconnection unit may be vertically aligned. For example, in the third virtual interconnection unit 203, three vias V are vertically aligned. In the fourth virtual interconnection unit 204, four vias V are vertically aligned.

Figure 3A:
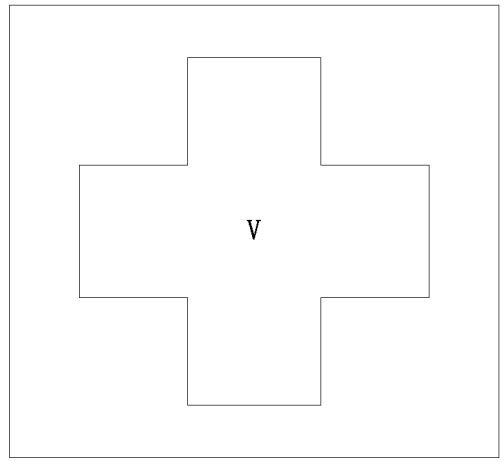
FIG. 3A to FIG. 3C are top views of virtual interconnection units.
Figure 3B:
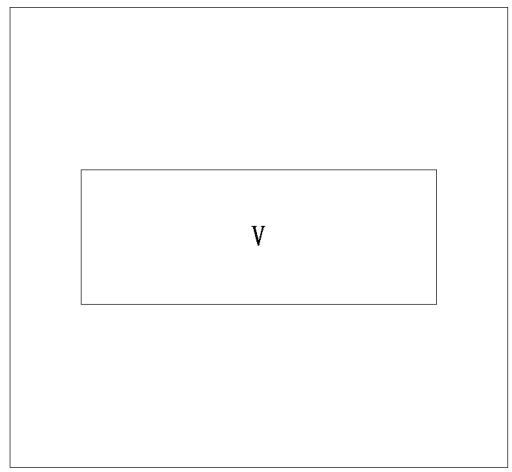
Figure 3C:
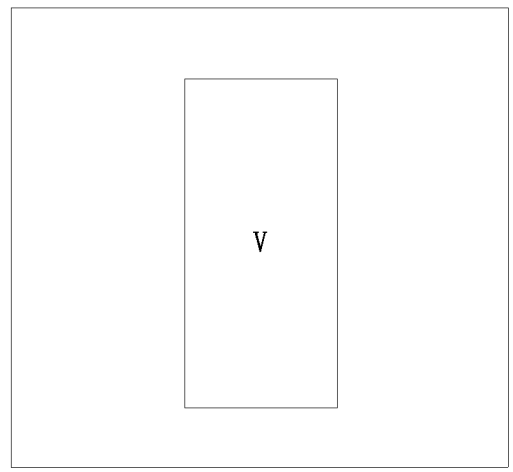

FIG. 3A to FIG. 3C are top views of virtual interconnection units. As shown in FIG. 3A, the shape of the via V may be a cross. As shown in FIG. 3B and FIG. 3C, the shape of the via V may be a rectangle or a line.

However, it should be understood that the shape of the via V is not limited to the shapes shown in FIG. 3A to FIG. 3C. The via V may be any shape that can be implemented by a manufacturing process.

As shown in FIG. 1, step 104: Fill an area (which may also be referred to as a non-circuit area hereinafter) in the chip design drawing outside the circuit area with virtual interconnection units.

In a process of filling the non-circuit area with the virtual interconnection units, the $j^{th}$ virtual interconnection unit is preferably filled, and a $(j-1)^{th}$ virtual interconnection unit is not filled unless there is no space in the non-circuit area for the $j^{th}$ virtual interconnection unit. In other words, when space in the non-circuit area allows, a virtual interconnection unit with many metal interconnection layers is preferably filled with the virtual interconnection units.

Figure 4:
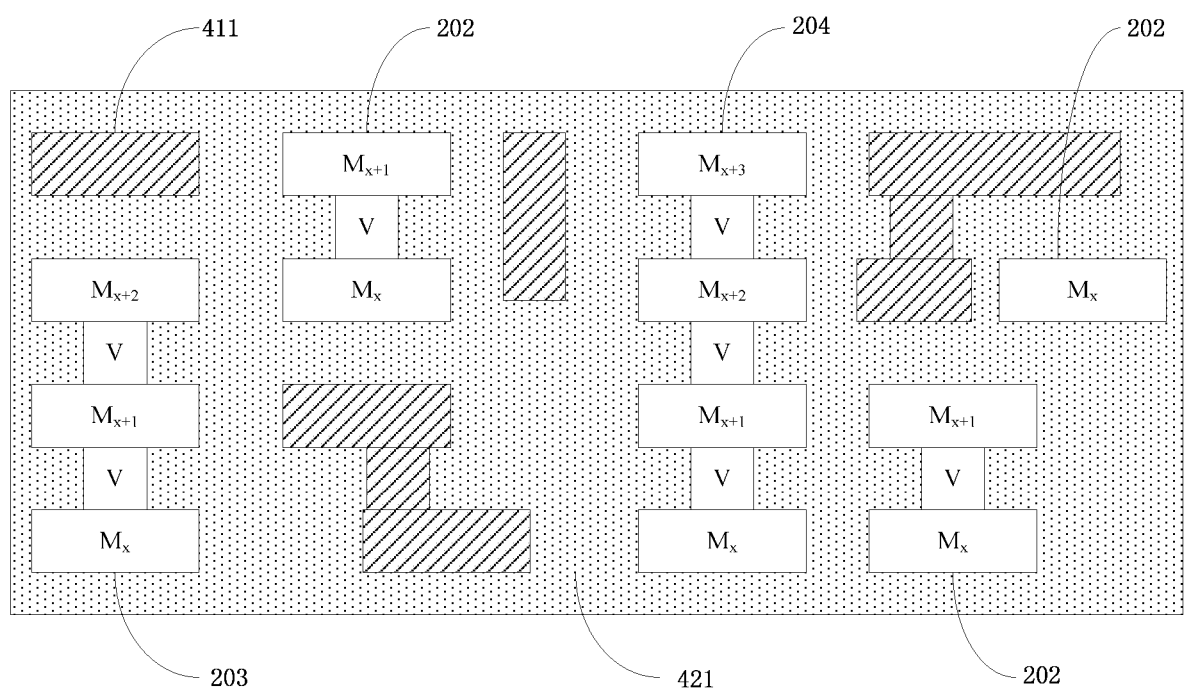
FIG. 4 is a schematic diagram of a chip design drawing with which virtual interconnection units are filled.

FIG. 4 is a schematic diagram of a chip design drawing with which virtual interconnection units are filled.

As shown in FIG. 4, the chip design drawing 400 includes a circuit area 411 and an area 421 other than the circuit area 411, that is, a non-circuit area. In a process of filling the area 421 with the virtual interconnection units, a fourth virtual interconnection unit 204 is preferably filled with, and a third virtual interconnection unit 203 is not filled with unless there is no space in the area 421 for the fourth virtual interconnection unit. Similarly, the third virtual interconnection unit 203 is filled, and a second virtual interconnection unit 202 is not filled unless there is no space in the area 421 for the third virtual interconnection unit. Similarly, the second virtual interconnection unit 202 is filled, and a first virtual interconnection unit 201 is not filled unless there is no space in the area 421 for the second virtual interconnection unit.

In the foregoing implementations, a non-circuit area is filled with the virtual interconnection units so that the metal interconnection layers are more uniformly distributed, thereby alleviating the micro loading effect. In addition, a laminated structure consisting of the metal interconnection layers and the vias may have a support function that prevents an external force from being applied to a chip in a subsequent packaging process so as to make a dielectric layer sink. In addition, via structures may further be used as stopping walls that prevent fine cracks caused by stress concentration from diffusing and extending. Therefore, the foregoing design of the interconnection structure can improve the shock-resistance and compression-resistance performance of the chip, thereby improving the reliability of chip package.

Figure 5:
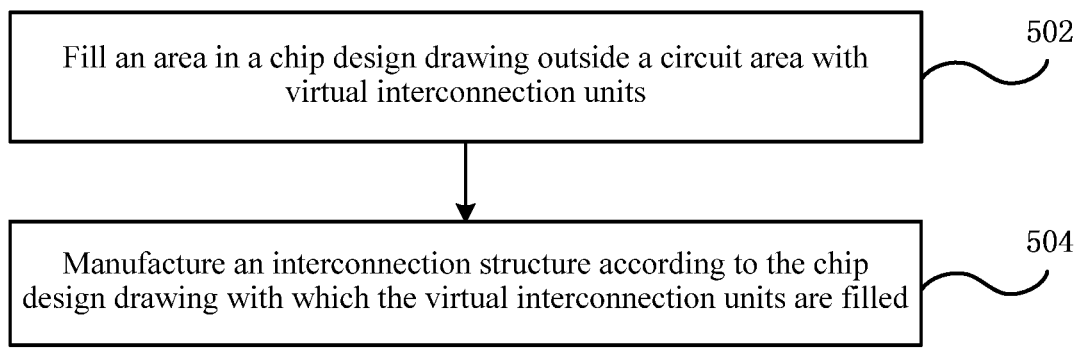
FIG. 5 is a simplified flowchart of a method for manufacturing an interconnection structure.

FIG. 5 is a simplified flowchart of a method for manufacturing an interconnection structure.

Step 502: Fill an area in a chip design drawing outside a circuit area with virtual interconnection units according to a design method according to any one of the foregoing implementations.

Step 504: Manufacture an interconnection structure according to the chip design drawing with which the virtual interconnection units are filled.

It should be understood that in a process of manufacturing the interconnection structure, the metal interconnection layers in the circuit area and metal interconnection layers in the virtual interconnection unit may be simultaneously formed, and via structures between the metal interconnection layers in the circuit area and via structures between the metal interconnection layers in the virtual interconnection units may also be simultaneously formed.

In the foregoing implementations, a non-circuit area is filled with the virtual interconnection units so that the metal interconnection layers are more uniformly distributed, thereby alleviating the micro loading effect in a manufacturing process. In addition, a laminated structure consisting of the metal interconnection layers and the vias may have a support function that prevents an external force from being applied to a chip in a subsequent packaging process so as to make a dielectric layer sink. In addition, via structures may further be used as stopping walls that prevent fine cracks caused by stress concentration from diffusing and extending. Therefore, forms of the interconnection structure manufactured according to the foregoing methods can improve the shock-resistance and compression-resistance performance of the chip, thereby improving the reliability of chip package.

Figure 6:
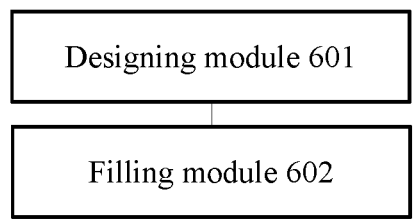
FIG. 6 is a schematic structural diagram of an apparatus for designing an interconnection structure.

FIG. 6 is a schematic structural diagram of an apparatus for designing an interconnection structure. As shown in FIG. 6, the apparatus includes a designing module 601 and a filling module 602.

The designing module 601 is configured to design n virtual interconnection units according to a number of metal interconnection layers in a circuit area of a chip design drawing, where n≥2. Here, an $i^{th}$ virtual interconnection unit includes i metal interconnection layers, where 1≤i≤n. Adjacent metal interconnection layers in a $j^{th}$ virtual interconnection unit are connected by using vias, where 2≤j≤n. In some implementations, the number of metal interconnection layers in the circuit area may be n. In some implementations, different vias in a same virtual interconnection unit are vertically aligned.

The filling module 602 is configured to fill an area in the chip design drawing outside the circuit area with virtual interconnection units. In a filling process, the $j^{th}$ virtual interconnection unit is filled, and a $(j-1)^{th}$ virtual interconnection unit is not filled unless there is no space in the area in the chip design drawing outside the circuit area for the $j^{th}$ virtual interconnection unit.

In foregoing implementations, non-circuit area is filled with the virtual interconnection units so that the metal interconnection layers are more uniformly distributed, thereby alleviating the micro loading effect. In addition, a laminated structure consisting of the metal interconnection layers and the vias may have a support function that prevents an external force from being applied to a chip in a subsequent packaging process so as to make a dielectric layer sink. In addition, via structures may further be used as stopping walls that prevent fine cracks caused by stress concentration from diffusing and extending. Therefore, the foregoing design of the interconnection structure can improve the shock-resistance and compression-resistance performance of the chip, thereby improving the reliability of chip package.

Figure 7:
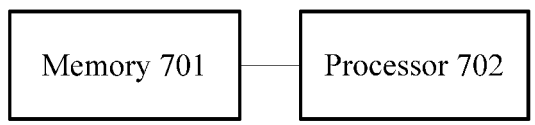
FIG. 7 is a schematic structural diagram of an apparatus for designing an interconnection structure.

FIG. 7 is a schematic structural diagram of an apparatus for designing an interconnection structure. As shown in FIG. 7, the apparatus includes a memory 701 and a processor 702. The memory 701 may be a magnetic disk, a flash memory, or any other non-volatile storage medium. The memory 701 is configured to store instructions corresponding to the method of any one of the foregoing embodiments or implementations. The processor 702 is coupled to the memory 701 and may be implemented as one or more integrated circuits such as a microprocessor or a microcontroller, for example. The processor 702 is configured to execute instructions stored in the memory 701, thereby improving the reliability of chip package.

Figure 8:
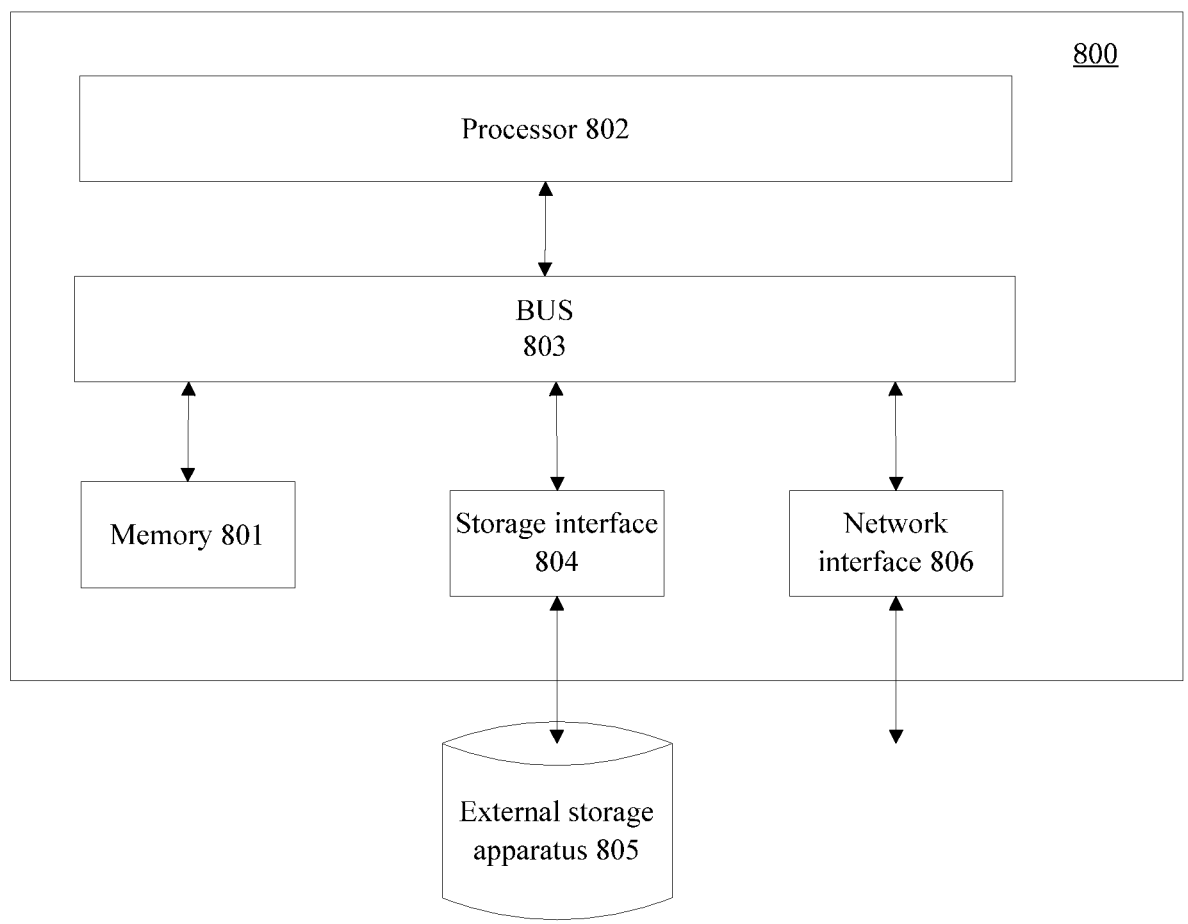
FIG. 8 is a schematic structural diagram of an apparatus for designing an interconnection structure.

FIG. 8 is a schematic structural diagram of an apparatus for designing an interconnection structure. As shown in FIG. 8, the apparatus 800 includes a memory 801 and a processor 802. The processor 802 is coupled to the memory 801 using a bus 803. The apparatus 800 may also be connected to an external storage apparatus 805 using a storage interface 804 to call external data or may be connected to a network or an external computer system (not shown) using a network interface 806.

In forms of the foregoing implementations, the memory stores data instructions, and then the processor processes the instructions, thereby improving the reliability of chip package.

The present disclosure further provides a computer readable storage medium storing computer program instructions, where the instructions, when being executed by a processor, cause the processor to perform steps of the method according to any one of the foregoing embodiments.

A person skilled in the art should understand that the embodiments and implementations of the present disclosure may be provided as a method, an apparatus, or a computer program product. Therefore, the present disclosure may use a form of hardware only embodiments, software only embodiments, or embodiments with a combination of software and hardware. In addition, the present disclosure may use a form of a computer program product implemented on one or more computer-usable non-transient storage media (including, but not limited to, a magnetic disc memory, a CD-ROM, and an optical memory) including computer-usable program code.

The present disclosure is described with reference to flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device so that a series of operations and steps are performed on the computer or the another programmable device, thereby generating computer-implemented processing. Therefore, the instructions executed on the computer or another programmable device provide steps for implementing a specific function in one or more processes in the flowcharts and/or in one or more blocks in the block diagrams.

The present disclosure has been described in detail so far. To avoid obstructing the concepts of the present disclosure, some details well known in the art are not described. A person skilled in the art will understand, according to the foregoing description, how to implement the technical solutions disclosed herein.

The methods and the apparatus of the present disclosure may be implemented in multiple manners. For example, the methods and the apparatus of the present disclosure may be implemented by using software, hardware, firmware, or any combination thereof. The sequence of steps of the method is merely used for description. Steps of the method of the present disclosure are not limited to the foregoing specifically described sequence unless particularly described in another manner. In addition, in some implementations, the present disclosure may further be implemented as programs recorded in a recording medium. These programs include machine readable instructions for performing the method according to the present disclosure. Thus, the present disclosure also includes the recording medium that stores the programs for performing the method of the present disclosure.

Although some particular embodiments and implementations of the present disclosure are described in detail by using examples, a person skilled in the art should understand that the foregoing examples are merely used for description and are not intended to limit the scope of the present disclosure. A person skilled in the art should understand that the foregoing embodiments may be amended without departing from the scope and the spirit of the present disclosure. The scope of the present disclosure is defined by the appended claims.

What is claimed is:

1. A method for manufacturing an interconnection structure comprising:
    generating, with a processor, a chip design drawing, wherein generating the chip design drawing comprises:
        designing n virtual interconnection units according to a number of metal interconnection layers in a circuit area of the chip design drawing, wherein an $i^{th}$ virtual interconnection unit comprises i metal interconnection layers, and adjacent metal interconnection layers in the $i^{th}$ virtual interconnection unit are connected by using vias, and n≥2, i≤n; and
        filling an area in the chip design drawing outside the circuit area with virtual interconnection units, wherein an $(i+1)^{th}$ virtual interconnection unit is filled, and the $i^{th}$ virtual interconnection unit is not filled unless there is no space in the area for the $(i+1)^{th}$ virtual interconnection unit; and
    manufacturing an interconnection structure according to the chip design drawing with which the virtual interconnection units are filled.

2. The method of claim 1, wherein n is the number.

3. The method of claim 1, wherein different vias in a same virtual interconnection unit are vertically aligned.

4. The method of claim 1, wherein the number of metal interconnection layers in the circuit area of the chip design drawing is n.

5. An apparatus for manufacturing an interconnection structure, comprising:
    a memory; and
    a processor in communication with the memory, wherein the processor is configured to execute instructions stored in the memory and to
        generate a chip design drawing, wherein to generate the chip design drawing, the processor is configured to:
            design n virtual interconnection units according to a number of metal interconnection layers in a circuit area of the chip design drawing, wherein an $i^{th}$ virtual interconnection unit comprises i metal interconnection layers, and wherein adjacent metal interconnection layers in the $i^{th}$ virtual interconnection unit are connected by using vias, and n≥2, i≤n; and
            fill an area in the chip design drawing outside the circuit area with virtual interconnection units, wherein the an $(i+1)^{th}$ virtual interconnection unit is filled, and the $i^{th}$ virtual interconnection unit is not filled unless there is no space in the area for the $(i+1)^{th}$ virtual interconnection unit; and
        cause an interconnection structure to be manufactured according to the chip design drawing with which the virtual interconnection units are filled.

6. The apparatus of claim 5, wherein n is the number.

7. The apparatus of claim 5, wherein different vias in a same virtual interconnection unit are vertically aligned.

8. The apparatus of claim 5, wherein the number of metal interconnection layers in the circuit area of the chip design drawing is n.

9. A computer readable storage medium storing computer program instructions, wherein the instructions, when being executed by a processor, cause a processor to perform acts of:
    generating a chip design drawing, wherein generating the chip design drawing comprises:
        designing n virtual interconnection units according to a number of metal interconnection layers in a circuit area of the chip design drawing, wherein an $i^{th}$ virtual interconnection unit comprises i metal interconnection layers, and adjacent metal interconnection layers in the $i^{th}$ virtual interconnection unit are connected by using vias, and n≥2, i≤n; and
        filling an area in the chip design drawing outside the circuit area with virtual interconnection units, wherein an $(i+1)^{th}$ virtual interconnection unit is filled, and the $i^{th}$ virtual interconnection unit is not filled unless there is no space in the area for the $(i+1)^{th}$ virtual interconnection unit; and
    causing an interconnection structure to be manufactured according to the chip design drawing with which the virtual interconnection units are filled.

10. The computer readable storage medium of claim 9, wherein n is the number.

11. The computer readable storage medium of claim 9, wherein different vias in a same virtual interconnection unit are vertically aligned.

12. The computer readable storage medium of claim 9, wherein the number of metal interconnection layers in the circuit area of the chip design drawing is n.

* * * * *